United States Patent [19]

Shen et al.

[11] Patent Number: 5,298,763
[45] Date of Patent: Mar. 29, 1994

[54] INTRINSICALLY DOPED SEMICONDUCTOR STRUCTURE AND METHOD FOR MAKING

[75] Inventors: Jun Shen, Phoenix; Saied Tehrani, Scottsdale; Herbert Goronkin, Tempe, all of Ariz.

[73] Assignee: Motorola, Inc., Schaumburg, Ill.

[21] Appl. No.: 970,456

[22] Filed: Nov. 2, 1992

[51] Int. Cl.$^5$ .................. H01L 29/161; H01L 29/205
[52] U.S. Cl. ........................ 257/22; 257/14; 257/25; 257/197; 257/201
[58] Field of Search .......... 257/12, 14, 201, 21, 257/22, 25, 197

[56] References Cited

U.S. PATENT DOCUMENTS

| | | | |
|---|---|---|---|
| 4,743,951 | 5/1988 | Chang et al. | 357/22 |
| 5,079,601 | 1/1992 | Esake et al. | 357/4 |
| 5,113,231 | 5/1992 | Soderstrom et al. | 357/16 |
| 5,124,771 | 6/1992 | Taira et al. | 257/201 |
| 5,159,421 | 10/1992 | Wolff. | |

FOREIGN PATENT DOCUMENTS

| | | | |
|---|---|---|---|
| 60-210880 | 10/1985 | Japan | 257/14 |
| 63-288061 | 11/1988 | Japan | 257/14 |
| 3-188674 | 8/1991 | Japan | 257/12 |

OTHER PUBLICATIONS

Beresford et al., App. Phys. Lett. vol. 56, No. 10, Mar. 5, 1990, pp. 952–954.

Longenbach et al. "Resonant Interband Tunneling in INAS/GaSb/InAs and GaSb/InAS/AlSb/GaSb Heteerostructures", Appl. Phys. Lett., vol. 57, #15 Oct. 8, 1990, pp. 1554–1556.

Primary Examiner—Rolf Hille
Assistant Examiner—Mahshid Saadat
Attorney, Agent, or Firm—Joe E. Barbee; Aaron Bernstein

[57] ABSTRACT

A semiconductor structure that provides intrinsic doping from native defects is provided. A quantum well including a narrow bandgap material (11, 14) having a low concentration of native defects is sandwiched between two wide bandgap spacer layers (12, 20, 17, 15). The spacer layers (12, 20, 17, 15) have a low concentration of native defects. At least one doping region (13, 16) having a high concentration of native defects positioned adjacent to one of the undoped spacer layers (12, 17).

13 Claims, 1 Drawing Sheet ced Semiconductor

INTRINSICALLY DOPED SEMICONDUCTOR STRUCTURE AND METHOD FOR MAKING

BACKGROUND OF THE INVENTION

The present invention relates, in general, to semiconductor devices and, more particularly, to a quantum well semiconductor structure having high mobility intrinsic doping.

Semiconductor devices are formed on a substrate comprising semiconductor material. Intrinsic semiconductor material usually has very high resistivity or is semi-insulating. Conventionally, the resistivity of semiconductor material is lowered by doping portions of the semiconductor material with atoms that provide electrons or holes. For example boron is a P-type dopant in silicon, while phosphorous and arsenic are N-type dopants. This type of doping is called extrinsic doping.

One problem with extrinsic doping is that the dopant atoms increase scattering of charge carriers moving in the semiconductor material. Increased scattering is reflected in lower mobility in the semiconductor material. Moreover, lower mobility results in devices with slower switching and higher power consumption. This problem is addressed to some degree by modulation doping in heterostructure semiconductor devices. Modulation doping physically separates the dopant atoms from the charge carriers that they provide using quantum wells and barriers.

Native defects in the semiconductor crystal also cause scattering and mobility degradation. Modulation doping does not prevent scattering caused by native defects. Usually, manufacturers attempt to minimize the concentration of native defects to improve mobility. Unfortunately, native defects can have beneficial effects in a semiconductor structure, and minimizing their concentration also minimizes these beneficial effects.

What is needed is a semiconductor structure that beneficially uses properties of native defects while minimizing scattering and mobility degradation caused by the native defects.

SUMMARY OF THE INVENTION

Briefly stated, the advantages of the present invention are achieved by a semiconductor structure that provides charge carriers from a native defect located remotely from the doped region. A quantum well is formed including a narrow bandgap material having a low concentration of native defects that is sandwiched between two wide bandgap spacer layers. The spacer layers have a low concentration of native defects. At least one doping region having a high concentration of native defects positioned adjacent to one of the undoped spacer layers.

In a method for intrinsically doping a semiconductor, a substrate is covered with a doping layer comprising a first material composition using a first set of growth parameters chosen to form a high concentration of native defects. A first spacer layer is formed comprising the first material composition using a second set of growth parameters that provide a reduced concentration of native defects. A first substantially undoped channel region including a narrow bandgap material is formed to cover the first spacer layer. A substantially undoped second spacer layer comprising the first material composition is formed covering the undoped channel using the second set of growth parameters to provide a reduced concentration of native defects.

DETAILED DESCRIPTION OF THE DRAWINGS

Figure 1:
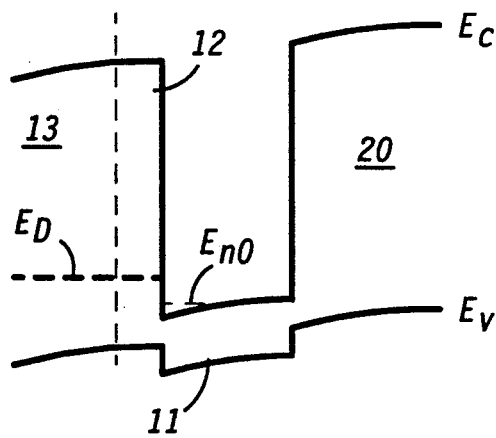
FIG. 1 illustrates a band diagram of a portion of a first embodiment semiconductor device having intrinsic doping, in accordance with the present invention.

Common semiconductor devices useful in the practice of the present invention include metal oxide semiconductor and bipolar transistors, diodes, resistors, capacitors, and the like. The band diagram shown in FIG. 1 illustrates a simple semiconductor structure having a substantially undoped channel region 11. The dashed vertical line in FIG. 1 represents an interface between the identified regions, and does not represent a perturbance in the conduction band ($E_c$) or valence band ($E_V$). The straight horizontal dashed line represents the Fermi energy level ($E_{no}$) and is provided for ease of reference. The term "substantially undoped" means that the region is substantially free of extrinsic doping atoms, but may still contain charge carriers provided by other portions of the structure. For example, channel region 11 is free of extrinsic doping atoms, but includes electrons donated by nearby doping region 13.

Recently, it was discovered that native defects can act as a source of charge carriers to provide intrinsic doping of a semiconductor region. Unfortunately, these native defects also are scattering sites, thus decrease mobility when they are physically near the charge carriers in an electronic device. This type of intrinsic doping is explained in detail in copending U.S. patent application Ser. No. 07/951,994 by the inventors of the present application filed on Sep. 28, 1992.

An important feature of the intrinsic doping structure in accordance with the present invention is that channel region 11 is separated from doping region 13 by undoped spacer region 12. A second undoped spacer region 20 is positioned so that channel region 11 is sandwiched between spacer regions 12 and 20 to form a quantum well. Undoped spacer region 12 comprises a wide bandgap material and is desirably approximately three nanometers thick so that charge carriers in doping regions 13 can tunnel through the spacer regions to the nearby channel region 11. Desirably, doping region 13 and spacer regions 12 and 20 comprise the same wide bandgap material. In the preferred embodiment, doping region 13 and spacer regions 12 and 20 comprise aluminum antimonide (AlSb) or gallium aluminum antimonide (GaAlSb).

Although illustrated as a structure having a doping region 13 formed on only one side of channel region 11, it should be understood that a second doping region (not shown) can be positioned on the other side of spacer region 20 to provide additional charge carriers to N-type region 11. When two doping regions are used, both spacer regions 12 and 20 must be of a predetermined thickness to allow charge carriers to tunnel into N-type region 11. When only one doping region 13 is used, spacer region 20 can be of arbitrary thickness.

Doping region 13 comprises a material selected to have a doping energy level ($E_D$) that is greater than the conduction band minimum of channel region 11, as illustrated by the bold dashed lines in FIG. 1. The doping energy level can be created either extrinsic dopant or by native defects that produce the desired energy level. Suitable materials for channel region 11 include indium arsenide (InAs) when doping region 13 comprises AlSb or AlGaSb.

Figure 2:
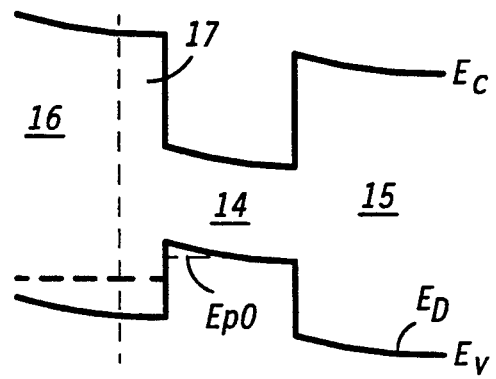
FIG. 2 illustrates a band diagram of a portion of a second embodiment semiconductor device having bipolar doping in accordance with the present invention.

FIG. 2 illustrates a band diagram of a simple semiconductor structure having a substantially undoped channel region 14. The dashed vertical line in FIG. 2 represents an interface between the identified regions, and does not represent a perturbance in the conduction band ($E_C$) or valence band ($E_V$). The straight horizontal dashed line represents the Fermi energy level ($E_{FO}$) and is provided for ease of reference. Like channel region 11 shown in FIG. 1, channel region 14 is free of extrinsic doping atoms, but includes holes donated by nearby doping region 16.

Channel region 14 is separated from doping region 16 by undoped spacer region 17. A second undoped spacer region 15 is positioned so that channel region 14 is sandwiched between spacer regions 17 and 15 to form a quantum well. Undoped spacer region 17 comprises a wide bandgap material and is desirably approximately three nanometers thick so that charge carriers in doping regions 16 can tunnel through spacer region 17 to the nearby channel region 14. Desirably, doping region 16 and spacer regions 17 and 15 comprise the same wide bandgap material. In the preferred embodiment, doping region 16 and spacer regions 17 and 15 comprise aluminum antimonide (AlSb) or gallium aluminum antimonide (GaAlSb).

Although illustrated as a structure having a single doping region 16 formed on one side of channel region 14, it should be understood that a second doping region (not shown) can be positioned on the other side of spacer region 15 to provide additional charge carriers to channel region 14. When two doping regions are used, both spacer regions 17 and 15 must be of a predetermined thickness to allow charge carriers to tunnel into channel region 14. When only one doping region 16 is used, spacer region 15 can be of arbitrary thickness.

Doping region 16 comprises a material selected to have a doping energy level that is less than the valence band maximum of channel region 14, as illustrated by the bold dashed lines in FIG. 2. The doping energy level can be created either by extrinsic dopant or by native defects that produce the desire energy level. Suitable materials for channel region 14 include gallium antimonide when doping region 16 comprises AlSb or AlGaSb.

One advantage of using native defects as a source of charge carriers in doping regions 13 (FIG. 1) and 16 (FIG. 2) is that native defects can provide both holes and electrons. One type of native defect that is particularly useful is the anion site anti-site native defect in the gallium-aluminum-antimonide system. This type of native defect is created by gallium or aluminum atoms positioned on an antimony site in the crystal lattice.

In a preferred example, $E_D$ is provided by an anion site-anti-site native defect created during the growth of doping regions 13 and 16. The anion site-anti-site native defect is a native defect in the GaAlSb material. The concentration of these native defects is controlled by selection of epitaxial growth parameters such as III/V ratio, temperature, growth rate and the like. Other methods of controlling native defect concentration will become available as active research continues in this field.

Figure 3:
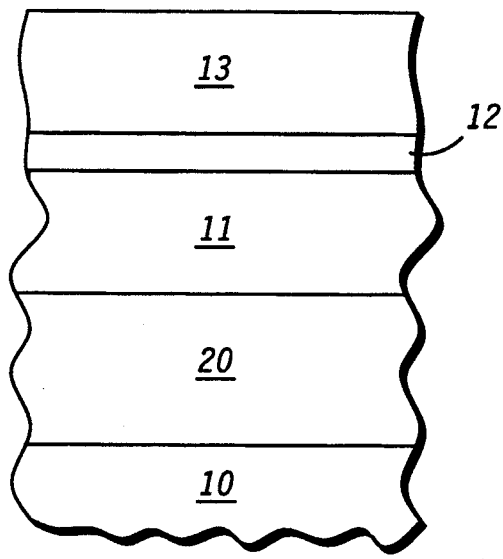
FIG. 3 illustrates a cross-sectional view of a portion of a semiconductor device shown in FIG. 1.

FIG. 3 illustrates a cross-section of an n-type doped semiconductor structure in accordance with the present invention. Layers 11-13 and 20 are formed on a crystal substrate 10 which comprises, for example, semi-insulating gallium arsenide (GaAs). It should be understood that the upper surface of substrate 10 usually includes an epitaxially grown buffer layer to improve crystal perfection and compatibility with subsequent epitaxial processing. For ease of illustration and understanding, however, a buffer layer is not separately shown in FIG. 3.

The device shown in FIG. 3 includes channel region 11 sandwiched between spacer regions 12 and 20. Doping region 13 is positioned adjacent to spacer region 12. Doping region 13 has native defects with a doping energy level $E_D$, as described hereinbefore. Charge carriers are provided by extrinsic doping atoms as well as by the suitable native defects.

Spacer region 20 is provided by depositing or growing a first wide bandgap material covering substrate 10. Epitaxial deposition techniques such as molecular beam epitaxy (MBE), atomic layer epitaxy (ALE) and the like are acceptable means for accomplishing the deposition step. During the deposition of spacer region 20, growth parameters are set to provide minimal native defect formation.

Channel region 11 is formed covering spacer layer 20. Channel region 11 comprises a second material composition having a narrow bandgap and in the example shown in FIG. 3 comprises InAs. In a preferred embodiment, growth parameters during the formation of channel region 11 provide a low concentration of native defects. A substantially undoped spacer region 12 is formed covering channel region 11 using the same growth parameters used for spacer region 20.

Doping region 13 is provided by depositing a layer of the wide bandgap material used for spacer regions 12 and 20. During the deposition, doping can be provided by creating native defects during the epitaxial growth or optionally by introducing extrinsic dopant atoms during epitaxial growth. To create native defects, a second set of growth parameters is used having altered temperature, growth rate, or III/V ratio, for example, to create a higher concentration native defects.

Figure 4:
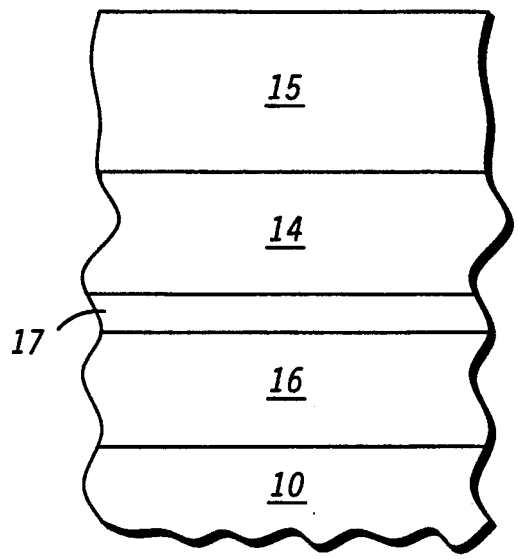
FIG. 4 illustrates a cross-sectional view of a portion of a semiconductor device shown in FIG. 2.

FIG. 4 illustrates the formation of P-type region 14 in a manner analogous to that used for channel region 11 in FIG. 3. FIG. 4 also illustrates that doping region 16 may be provided below the region to be doped, as well as above the region to be doped as shown in FIG. 3. Composition and doping material of doping region 16 is substantially the same as for doping region 13 (FIG. 3) described hereinbefore. Doping region 16 is covered by a spacer layer 17, which is in turn covered by channel region 14. Because doping region 16 is nearby channel region 14, it provides holes to the valence band of channel region 14, and thus acts as a P-type dopant. Channel region 14 comprises a material such as GaSb in the preferred embodiment.

Channel region 14 is covered by another spacer layer 15, which serves to confine charge carriers in channel regions 14. Another doping region 16 (not shown) can be formed covering spacer 15 and separated from channel region 14 by the thickness of spacer 15 to provide additional charge carriers to channel region 14.

Many layers of channel region 14 and channel regions 11 can be stacked vertically by simple repetition of the basic processes described above. Layers are laminated onto the structure, each layer patterned to form active devices or device elements. Each channel region 14 and channel regions 11 is separated from adjacent layers by a wide bandgap spacer 12 or 17.

By now it should be appreciated that a semiconductor device having doping provided by an intrinsic dopant material is provided. Holes and electrons are provided to channel and channel regions while keeping scattering sites created by native defects physically separated from the doped regions.

We claim:

1. An intrinsically doped semiconductor structure comprising:
    a quantum well including a narrow bandgap material having a low concentration of native defects sandwiched between two wide bandgap spacer layers, wherein the spacer layers have a low concentration of native defects;
    at least one doping region having a high concentration of native defects positioned adjacent to one of the undoped spacer layers; and
    wherein the quantum well is provided with charge carriers primarily from the native defects of the doping region.

2. The intrinsically doped semiconductor structure of claim 1 wherein the quantum well and the at least one doping region are substantially free of extrinsic doping atoms.

3. The intrinsically doped semiconductor structure of claim 1 wherein the doping region further comprises anion site anti-site native defects which provide the charge carriers.

4. The intrinsically doped semiconductor structure of claim 1 wherein the wide bandgap spacer layers and the doping region comprise aluminum antimonide.

5. The intrinsically doped semiconductor structure of claim 4 wherein the narrow bandgap material comprises indium arsenide.

6. The intrinsically doped semiconductor structure of claim 1 wherein the narrow bandgap material comprises gallium antimonide.

7. An intrinsically doped semiconductor structure comprising:
    a substrate;
    a first doping region substantially comprising a first material composition having a large bandgap energy, wherein the first doping region covers an upper surface of the substrate and includes a high concentration of native defects;
    a first spacer region comprising the first material composition covering the doping region, wherein the first spacer region has a low concentration of native defects;
    an undoped channel comprising a second material composition having a narrow bandgap and a low concentration of native defects, wherein the undoped channel covers the first spacer region and wherein the undoped channel is provided with charge carriers primarily by the native defects of the first doping region; and
    a second spacer region comprising the first material composition and having a low concentration of native defects, wherein the first and second spacer regions have a predetermined thickness small enough to allow tunneling of the charge carriers from the doping region to the undoped channel and large enough to minimize scattering of charge carriers in the undoped channel by the native defects in the doping region.

8. The intrinsically doped semiconductor structure of claim 7 wherein the doping region further comprises a single species of extrinsic dopant atoms selected to provide a doping energy level above the conduction band minimum or below the valence band maximum for the undoped channel.

9. The intrinsically doped semiconductor structure of claim 7 wherein the native defects in the doping region include anion site anti-site native defects located in the doping region.

10. The intrinsically doped semiconductor structure of claim 9 wherein the first material composition is aluminum antimonide.

11. The intrinsically doped semiconductor structure of claim 9 wherein the doping region is substantially free of extrinsic doping atoms.

12. The intrinsically doped semiconductor structure of claim 10 wherein the second material composition is indium arsenide.

13. The intrinsically doped semiconductor structure of claim 10 wherein the second material composition is gallium antimonide.

* * * * *